(12) United States Patent
Struckman

(10) Patent No.: US 7,119,739 B1
(45) Date of Patent: Oct. 10, 2006

(54) NEAR FIELD TO FAR FIELD DF ANTENNA ARRAY CALIBRATION TECHNIQUE

(75) Inventor: Keith A. Struckman, Grand Junction, CO (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 166 days.

(21) Appl. No.: 10/470,590

(22) Filed: Sep. 17, 2003

Related U.S. Application Data

(60) Provisional application No. 60/380,505, filed on May 14, 2002.

(51) Int. Cl.
*G01S 7/40* (2006.01)
*H01Q 3/26* (2006.01)

(52) U.S. Cl. .................................. 342/174; 342/372

(58) Field of Classification Search ............... 342/165, 342/169, 170, 174, 368, 372
See application file for complete search history.

(56) References Cited

U.S. PATENT DOCUMENTS

| | | | | |
|---|---|---|---|---|
| 3,766,559 A | * | 10/1973 | Butcher et al. | 342/368 |
| 4,280,128 A | * | 7/1981 | Masak | 342/368 |
| 5,039,991 A | | 8/1991 | Boese et al. | |
| 5,721,554 A | * | 2/1998 | Hall et al. | 342/165 |
| 2003/0038747 A1 | * | 2/2003 | Patel et al. | 342/174 |

OTHER PUBLICATIONS

K.A. Struckman, Synthesis of DF array calibration manifolds from near-field measurements, IEEE Antennas and Propagation Society International Symposium, vol. 1, p. 711-714, Jun. 2004.*

L. Duchesne et al., Compact multiprobe antenna test station for rapid testing of antennas and wireless terminals, 10th Asia-Pacific Conference on Communications and the 5th International Symposium on Multi-Dimensional Mobile Communications Proceedings, vol. 2, p. 553-557, Aug.-Sep. 2004.*

A.J. Weiss et al., Manifold interpolation for diversely polarised arrays, IEE Proceedings—Radar, Sonar and Navigation, vol. 141(1), p. 19-24, Feb. 1994.*

R.B. Ertel et al., Antenna array hardware amplitude and phase compensation using baseband antenna array outputs, IEEE 49th Vehicular Technology Conference, vol. 3, p. 1759-1763, May 1999.*

R.C. Johnson et al., Determination of far-field antenna patterns from near-field measurements, □□Proceedings of the IEEE, vol. 61(12), p. 1668-1694, Dec. 1973.*

N. Saucier and K. Struckman, *Direction Finding Using Correlation Techniques*, IEEE Antenna Propagation Society International Symposium, pp. 260-263, Jun. 1975.

* cited by examiner

*Primary Examiner*—Thomas H. Tarcza
*Assistant Examiner*—F H Mull
(74) *Attorney, Agent, or Firm*—Joseph E. Funk; Daniel J. Long

(57) ABSTRACT

A technique is disclosed for calculating the phase and amplitude weighting factors for use with a specific compact antenna range that synthesize an in phase, constant amplitude planar wave front that appears to have been transmitted from the far field. The weighting factors are used to weight RF signals after they are received by a full size or scaled radio direction finding array mounted on a platform during testing of the antenna array on the compact antenna range. The weighted received signals accurately replicate the antenna array response in the far field, including electromagnetic glint caused by the platform on which the antennas are mounted, and are stored in complex voltage form as a calibration table for the array.

20 Claims, 9 Drawing Sheets

FIG. 5A $\quad V_{ant}(k)_{cal}(\theta_i, \phi_i) = W_i \times V_{ant}(k)_{FZ}(\theta_i, \phi_i)$
$\qquad + \sum_{m=1}^{M} W_m \times V_{ant}(k)_{FZ}(\theta_m, \phi_m)$ FIG. 5B $\quad W_m \times Tr = (W_m^I + i \times W_m^Q) \times (Tr^I + i \times Tr^Q)$
$\qquad = (W_m^I \times Tr^I - W_m^Q \times Tr^Q) + i \times (W_m^I \times Tr^Q + W_m^Q \times Tr^I)$ FIG. 5C $\quad I_{cal}(x_k, y_l) + i \times Q_{cal}(x_k, y_l) = W_i \times Tr\{(\theta_i, \phi_i), (x_k, y_l)\}$
$\qquad + \sum_{m=1}^{M} W_m \times Tr\{(\theta_m, \phi_m), (x_k, y_l)\}$ FIG. 5D $\quad \text{Objective} = \sum_{k=1}^{K} \sum_{l=1}^{L} |\{I_{cal}(x_k, y_l)\} + i \times Q_{cal}(x_k, y_l)\} - \{I_{ff}(x_k, y_l) + i \times Q_{ff}(x_k, y_l)\}|^2$ FIG. 5E $\quad \hat{R}(\phi^t) = \dfrac{\sum^{N} \hat{v}_n(\phi^i) \cdot \hat{v}_n^*(\phi^t)}{\left(\sum^{N} |\hat{v}_n(\phi^i)|^2\right)^{1/2} \cdot \left(\sum^{N} |\hat{v}_n(\phi^t)|^2\right)^{1/2}}$ FIG. 5F $\quad |\hat{R}| = \dfrac{1}{N} \left[ \dfrac{\sin \dfrac{N(\psi^i - \psi^t)}{2}}{\sin\left(\dfrac{\psi^i - \psi^t}{2}\right)} \right]^2$

NEAR FIELD TO FAR FIELD DF ANTENNA ARRAY CALIBRATION TECHNIQUE

CROSS REFERENCE TO RELATED APPLICATION

This utility patent application relates to U.S. provisional patent application No. 60/380,505, entitled "Planar Wave Synthesis of DF Array Calibration Manifolds From Near-Field Fresnel Zone Measurements", and filed May 14, 2002.

FIELD OF THE INVENTION

This invention relates generally to compact antenna range measurements and a technique for transforming near field antenna measurements into accurate far field patterns that can be used for far field direction finding array calibration manifolds and other antenna array outputs.

BACKGROUND OF THE INVENTION

As is known in the prior art, antennas that transmit or receive signals directionally must be calibrated when they are mounted on platforms of any type because the platforms create measurement errors due to mechanical distortions in the antennas and spurious reflections, such as multi-path reflections, from portions of the platform on which the antenna is mounted.

In the prior art, antenna calibrations were performed in the far field. For measurements made in the far field, the distance between the test antenna and the signal transmitting source (or receiver) must be greater than $2D^2/\lambda$, where D is a characteristic dimension of the test antenna and $\lambda$ is the wavelength. For antennas having significant aperture phase deviations and requiring low measurement uncertainties, the spacing required can exceed $8D^2/\lambda$. From this mathematical relation it can be seen that large distances are required for far field testing of large aperture (D), high frequency antennas. For example the testing distance required for far field pattern measurement of a 12 GHz parabolic reflector antenna with a 12 ft diameter would be 3500 ft. Because of such large distances far field tests must be conducted outdoors where the testing is constrained by weather and the transmission path is influenced by the weather. In addition, the path between a test antenna and a transmission source must be controlled to preclude variations caused by reflections from traffic entering the path.

In view of various problems, including those described in the previous paragraph, it is impractical to test large antennas in the far field. Fortunately, techniques have been developed to measure the far field pattern of an antenna under test on smaller indoor ranges under controlled conditions. This is called near field antenna testing. Near-field testing of an antenna is a technique that calculates a far field antenna pattern from multiple radio frequency measurements taken very close to either a transmitting antenna or a receiving antenna. The results of near field testing results are usually more accurate due to better control of spurious reflections and because the testing can usually be done indoors under controlled conditions. More specifically, advantages of near field antenna testing using these smaller ranges include: (a) reduction of outside interference, (b) reduction of testing time lost to poor weather conditions, (c) the ability to do classified testing, and (d) the reduction of electromagnetic transmissions into the environment. This last point is especially important with the current interest in environmental impact analysis. Unfortunately, when applied to the DF array calibration problems most compact antenna range processing solutions are much more complex than required for DF array manifold generation.

The far field antenna pattern is of vital concern to a system that uses a directional antenna. The far field pattern details the direction and shape of the antenna main lobe and its side lobes. Side lobes show where and how much signal an antenna will pick up or signals that will be transmitted outside of the main lobe, which is the direction of primary interest. Antenna designers normally try to make side lobes as small as possible.

In the prior art, for near field testing of an antenna, a test probe (a small antenna) is moved over a plane in front of the antenna under test, or over a cylindrical or spherical surface surrounding the antenna under test. The test probe antenna transmits or receives radio frequency signals to or from the antenna under test. The amplitude and phase of the received RF signal is recorded by the test probe at specific and equally spaced locations. A computer program processes this data and predicts the far field pattern for the antenna. The increasing power of digital computers has made this near field testing technique much easier and faster to use.

Four distinct methods or techniques of near field scanning have been developed in the prior art. These are the planar (plane-rectangular), plane-polar, cylindrical, and the spherical scanning methods. Each has particular advantages for certain applications, but all have serious limitations for the maximum size of antenna that can be measured. For example, the planar method is best suited for high gain antennas, does not require the antenna under test to move, and uses a test probe antenna that scans a rectangular measurement plane immediately in front of the antenna aperture. Probe scanning arrangements of this type are complex because the probe must be accurately moved in two directions (X,Y) to cover the entire measurement (scan) plane. A planar scanner is extremely expensive to fabricate as it gets larger because of the high mechanical tolerances that must be maintained to obtain high quality measurement results. Planar scanners in use now are typically less than about six meters maximum dimension, but some are larger.

Plane-polar scanners are similar in application to planar (plane-rectangular) scanners. They require the antenna to rotate about a single axis and use a probe that moves along a line perpendicular to and intersecting the antenna rotation axis. The combined motion produces a circular disc measurement surface immediately in front of the antenna aperture. This method can handle antennas larger than for the planar scanner method but requires the test antenna to be rotated. Again, as the antenna size grows, the method becomes very expensive and is not practical for extremely large antennas. The largest antenna measured in this way was twenty meters in diameter. Also, the computation of the far field is a little more difficult because the data samples are distributed on concentric rings rather than on a rectangular grid.

With the cylindrical scanning technique, the measurement plane is a cylinder surrounding the antenna under test and the cylinder oriented coaxially with the rotation axis of the antenna. The probe moves along a line parallel to the rotation axis. Computation of the far field is more complicated and time consuming than in planar scanning and, since the method requires motion of the antenna, it is limited to the measurement of modest size antennas.

The spherical scanner technique requires the antenna under test to rotate about two orthogonal axes, and uses a stationary antenna probe. The motion of the antenna relative to the stationary probe antenna produces an apparent spherical measurement surface centered at the antenna. The method is limited to fairly small antennas because of the complex antenna rotation needed. Also, the computations required to obtain the far field data are much more complicated than the planar case and may be prohibitive for large antennas.

Each of the four methods listed can not be applied to large antennas of 30–100 meters or larger in size. For planar scanning, scanner construction to maintain the required tolerance is technically and financially prohibitive. For the other methods, the machinery necessary to rotate the antenna is similarly prohibitive. In addition, the superstructures required to support and move the measurement antenna probe in the planar, plane-polar, and cylindrical methods can produce unwanted reflections that limit the accuracy of the measurement. Further, locating test probe antennas in the near field where the transmit beam of a transmitting antenna is unfocused may result in unacceptable performance, primarily due to phase errors and due to the magnification of the effects of system design tolerances. In general, near-field scanning requires extremely careful mechanical alignment and the problems of maintaining this alignment are increased with size of an antenna under test.

In most spherical near field antenna testing two orthogonal axes describe positioning of a test probe antenna over a spherical surface surrounding and centered on the antenna under test. The axes are azimuth phi ($\phi$), and elevation which is zenith minus theta ($\theta$) (measured from the vertical). For high accuracy the two axes must be close to 90 degrees from each other, the probe must be at a constant radius on a sphere from the antenna under test, and the probe position must be accurately known. In most spherical near-field antenna testing an antenna under test is rotated on a turntable while a test probe is only moved up and down along the spherical surface to cause an effective probe movement over the spherical surface at a fixed elevation.

U.S. Pat. No. 5,039,991 issued Aug. 13, 1991 to Boeing describes a test system for processing antenna outputs from scaled direction finding (DF) antennas, on a scaled aircraft test platform, with a scaled RF signal. The DF antennas developed and tested by the system disclosed in this patent are to be mounted on an aircraft and to accurately determine the direction of a source of received electromagnetic radiation. The aircraft platform itself perturbs the phase and amplitude of received electromagnetic radiation and this is accounted for by the calibration process.

A correlation device is used for correlating signals received by a plurality of actual DF antennas on the actual aircraft with data that is empirically derived using the scaled test model and stored in a database representative of the performance of DF system (DF antennas and aircraft). The amplitude and phase characteristics of transmissions received from a signal source are correlated to the stored data and the azimuth and elevation angle of the signal source is determined from the stored data that most nearly correlates to the measured amplitude and phase generated complex vectors.

The most elemental form of DF system determines the azimuth of RF transmissions received by the antenna system in a single horizontal plane. In addition to determining azimuth information, the elevation of received RF transmissions in a vertical plane and range data of the received RF transmissions can also be determined.

The spacing of antenna elements on an aircraft to be modeled is typically established as a function of the wavelength of the RF transmissions to be received. Thus, to allow the use of an antenna model that is physically smaller than the actual antenna, the RF transmissions used during modeling must have a wavelength that is proportionally smaller than the wavelength of the transmissions to be received by the actual antenna. For example, if the model antenna is one-tenth the size of the actual antenna, and the aircraft platform model is one-tenth the size of the actual aircraft, the frequency of the RF transmissions used to evaluate the model's performance must be ten times that of the RF transmissions to be received by the actual antenna and aircraft.

The prior art modeling described in the previous paragraphs for U.S. Pat. No. 5,039,991 scales the values of the parameters in the equation $2D_2/\lambda$, which defines the far field, so that model antenna and model platform testing data gathered using scaled frequencies is actually gathered in the far field as defined by the equation. While this redefined far field distance is shorter than when testing with full size antennas and platform, such as an aircraft, it is still relatively large when compared to gathering model data in the near field (less than $2D_2/\lambda$), and then converting the near field data to the far field for use in correlation of signals received by DF antennas on an actual platform.

An earlier paper by N. Saucier and K. Struckman, *Direction Finding Using Correlation Techniques*, IEEE Antenna Propagation Society International Symposium, pp. 260–263, June 1975, teaches the same thing as taught in U.S. Pat. No. 5,039,991.

U.S. Pat. No. 5,721,554, issued on Feb. 24, 1998 to Stanley R. Hall et al., describes a near field planar wave front generation method that uses a relatively small number (three to five) of transmitting antennas to create a synthesized one-dimensional linear plane of radiation over 10 to 20 wavelengths at a specific location on an antenna array of a system under test at a specific frequency and distance, typically in the range of from 100 to 200 feet. Hall et al. do not suggest a down range returns simulator according to the claimed invention.

Thus, there remains a need in the prior art for a simpler, more accurate way of performing near field testing of antennas on a compact antenna range of a size less than one-hundred feet, and more particularly of spherical, near field, antenna testing, and then using the test data to create a calibration table that is used to correct actual measurements in the far field.

There also remains a need in the art for a technique for transforming near field measurement data into an accurate far field calibration table for correcting direction finding and other antenna type outputs.

SUMMARY OF THE INVENTION

The foregoing needs in the prior art are satisfied by the present invention. A compact antenna range and method are taught that provide a simpler, more accurate way of performing near field testing of DF antennas and arrays that may be full sized or scaled in size to create a far field calibration table for radio direction finding systems. In the following summary of the invention, and in the detailed description thereafter, only a scaled model direction finding (DF) antenna array mounted on a scaled model platform is mentioned for simplicity of explanation. However, full size DF antennas and platforms may be tested if they will fit on the turntable of the compact antenna range.

The compact antenna range comprises a single test probe antenna located on a hemisphere above a turntable on which DF antennas are positioned to be tested. As the turntable is rotated and the test probe antenna array is moved vertically along the surface of the hemisphere, signals are transmitted by the test probe antenna to a DF antenna under test on the turntable.

Before DF antenna testing is performed the compact antenna range must be calibrated. This calibration is done purely mathematically, by computing a table of weighting factors specifying phase and amplitude of RF signals that will later be synthetically transmitted by the test probe antenna at different angles of elevation on the hemisphere and different azimuth angles of the turntable. Each combination of an angle of elevation of the test probe antenna and an azimuth setting of the turntable defines a vector to a "test point" on the hemisphere. The use of the calculated weighting factors defines the best possible, in phase, constant amplitude, planar wave front across the entire surface of the antenna range turntable.

In accordance with the teaching of the preferred embodiment of the invention the calibration weighting factor calculations for each test point on the hemisphere are made using a least mean square calculating algorithm, such as a gradient based convergence algorithm. For each test point the calculation of weighting factors (amplitude—and phase if necessary) uses the weighting factors calculated for a number of surrounding test points to thereby define the best emulated, in phase, constant amplitude planar wave front over the surface of the turntable. This is a complex weighting and summing process that effectively transforms the near field calculations to the far field. The number of surrounding test points utilized in the calculations determines how planar the in phase, constant amplitude planar wave front is. The least mean square calculations are carried on until it is determined that an emulated in phase, constant amplitude planar wave front will be generated across the surface of the turntable. The weighting factors are later used when testing a full size or scaled down DF antenna and platform on the turntable at different elevations, azimuths and frequencies to directly produce a far field calibration table.

For antenna testing a scaled model of a DF antenna array and the platform on which it is mounted are placed on the turntable of the compact antenna range to be tested using RF test signals the frequency of which are also scaled in a manner known in the prior art. As the turntable is rotated to specific angles of azimuth, and the test probe antenna is moved up and down along the surface of the hemisphere to specific angles of elevation, the RF signals of different frequencies are transmitted.

A DF receiver connected to the scaled DF antenna array on the turntable processes signals received by the individual antenna elements of the DF antenna array under test for each of the test points, and provides a measured indication of the azimuth, angle of elevation and frequency. Using the teaching of the invention the RF signals received using the DF antenna array are weighted using the previously calculated weighting factors and are stored to create the calibration table. The calibration table is created for use in actual operation of a full scale platform with the DF antennas. The calibration table contains the received test signals of known frequency in a complex vector format (real and imaginary vectors) along with the actual azimuth and angle of elevation set during testing for each test point. The known frequency is corrected from a scaled frequency used when performing scaled DF antenna array testing.

In actual operation each signal received by a full size DF antenna with DF receiver has an amplitude and phase and is converted to complex vector format (real and imaginary vectors). The complex vectors are compared by pattern matching to the complex vectors stored in the calibration table during antenna model testing to directly determine the correct azimuth and angle of elevation of a received signal. In this manner, using the teaching of the invention, more accurate direction finding is accomplished than previously possible in the prior art.

An advantage provided by the teaching of the present invention is that the calibration table that is developed on the compact antenna range defines a near field manifold for the direction finding antenna array, and the near field manifold is of the same size and spans the same incident angle in space as a manifold developed for the direction finding antenna array in the far field.

DESCRIPTION IF THE DRAWINGS

The invention will be better understood upon reading the following Detailed Description in conjunction with the drawing in which:

FIGS. 5a–5f show various equations used in calculating weighting factors;

DETAILED DESCRIPTION

Figure 1:
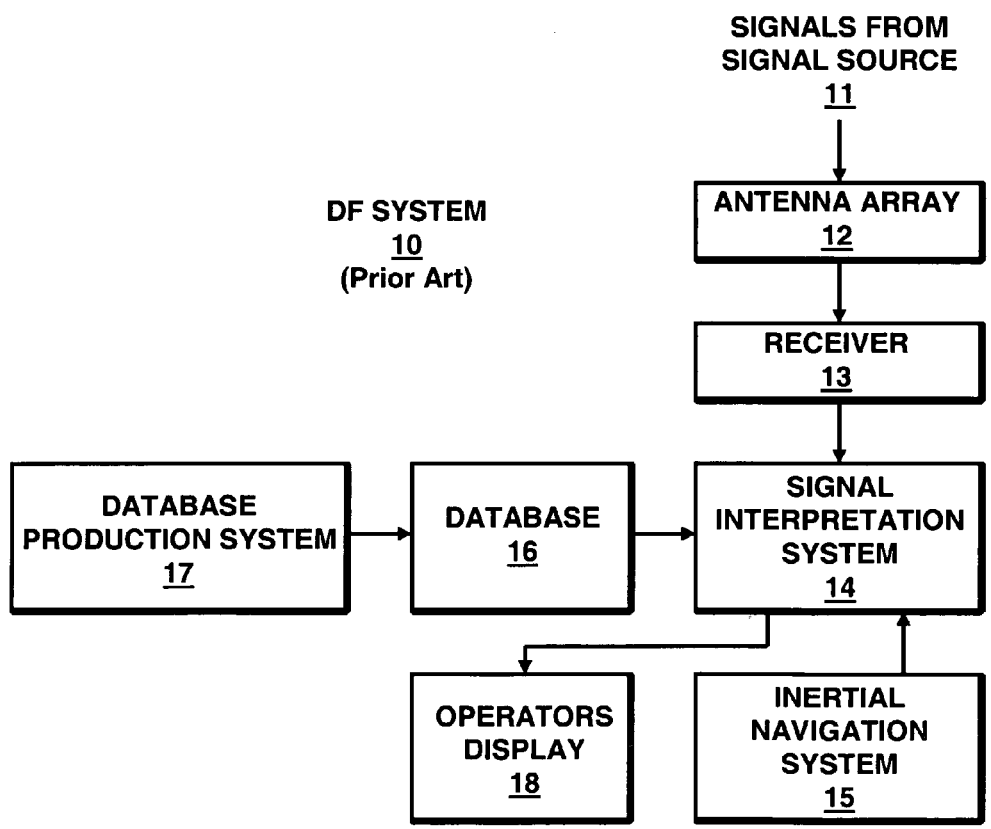
FIG. 1 is a block diagram of a prior art system in which the present invention may be utilized.

In FIG. 1 is shown a block diagram of a prior art direction finding (DF) system used for receiving and accurately interpreting radio frequency (RF) signals from a remote signal source 11. In actual operation signals received by DF antenna array 12 from a remote signal source 11 may be any one of a number of types of signals. For example, DF system 10 may be used in a communication intercept application in which the received signals are from, for example, aircraft or ground emitter produced RF communication transmissions in the VHF through L bands of the electromagnetic frequency spectrum. If DF system 10 is on an aircraft, an independent inertial navigational system 15 is also required in order to perform an accurate determination of the location of the aircraft so the signals from source 11 can be accurately determined.

DF system 10 includes a receiver 13 and a signal interception and DF system 14. Signal interception and DF system 14 uses a database 16 which is stored by system 10 to properly interpret RF signals received by DF antenna array 12 and receiver 13 from remote signal source 11. Database 16 includes information about the performance of receiver 13 and signal interception system 14 under certain operating conditions, and is initially established by a database production system 17, which is not normally part of DF system 10, during near field calibration testing on a compact antenna range.

The near field to far field range transformation algorithm of the prior art does not take into account the effect of amplitude taper across a particular antenna aperture. This amplitude taper can be significant, and obviously much different than that associated with the true far field. In the absence of using the present invention amplitude degradation can create unacceptable DF errors.

In actual operation, prior art DF system 10 uses signal transmissions from a remote source 11 and received by DF antenna array 12 and receiver 13, along with the information previously stored in correlation database 16, to perform direction finding substantially uninfluenced by the environmental perturbations. This is done by correlating received signals with data in database 16 to obtain the correct azimuth and elevation information for each received signal. The azimuth and elevation of each intercepted signal is displayed on an operator's display 18.

With prior art compact antenna ranges near field testing is performed and the measured results are transformed to the far field using a near field to far field equation, such as taught in U.S. Pat. No. 5,039,001, to create a correlation database. Near field calibration testing for direction finding (DF) antenna arrays has become an accepted technique that allows a DF antenna array to be calibrated much more rapidly than can be done measuring far-field data in the far field. Short/compact antenna ranges are also beneficial because they increase measurement signal-to-interference-plus-noise levels, thus decreasing modeling errors.

When a DF array antenna is to be tested, it and the platform on which it will be mounted in actual use, and the frequencies it is designed to receive, are scaled to fit and be tested on a turntable of a compact antenna range such as shown in and described with reference to FIG. 2. At each of a plurality of defined test points, each having a unique elevation, azimuth and frequency, readings are taken. The data is then transformed into far field data that creates a calibration table for use during DF field measurements.

More specifically, a scaled DF antenna array being tested in a compact antenna range must meet the same physical and electrical requirements as a full-scale version of the same DF antenna array employed in DF system 10. The requirements that must be met over the intended frequency band of operation include the antenna's voltage standing wave ratio (VSWR), coverage/gain, and physical size, including length, width, and thickness.

Figure 2:
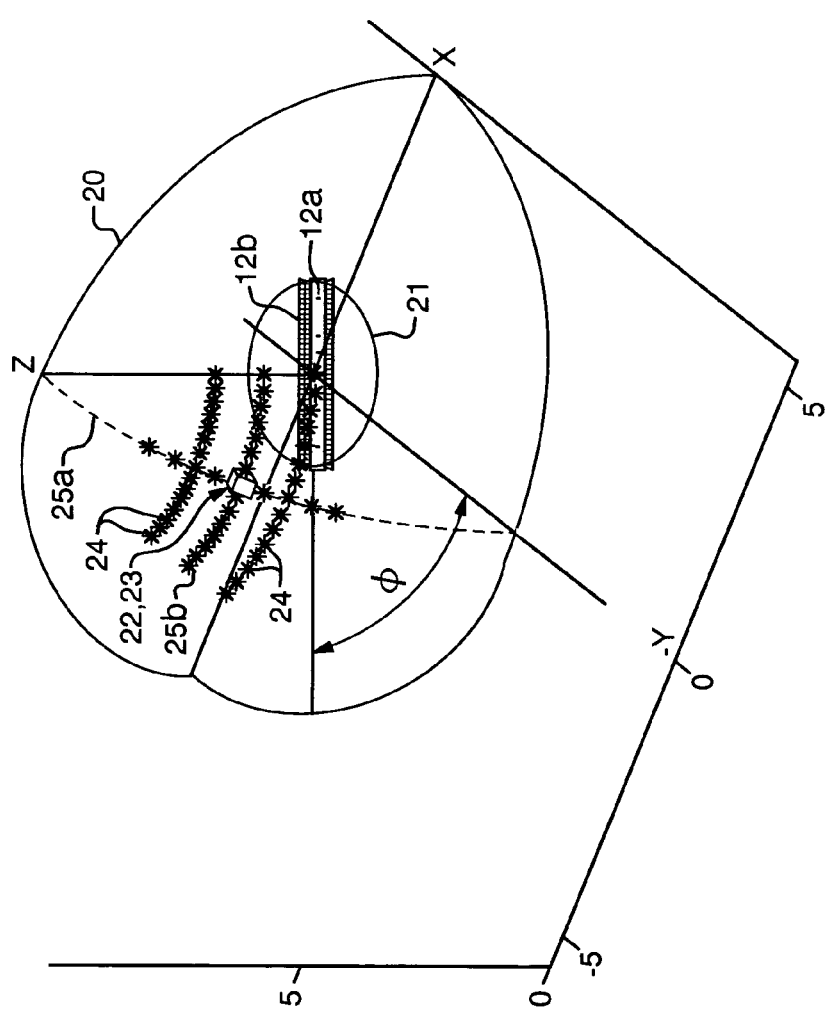
FIG. 2 shows a spherical, near field, compact antenna range having a turntable with which the teaching of the present invention may be utilized.

Referring to FIG. 2, to perform near field testing on the short/compact antenna range shown therein, a scaled model platform 12b, such as an airplane (not shown), or a cylindrical reflector with DF antenna array 12a thereon are placed on a 3.0 meter diameter turntable 21 centered under an 11.0 meter radius hemispherical surface 20. Mounted on a track mechanism positioned along axis 25, a test probe antenna 22 is moved up and down along the axis. Platform 12b is assumed to be the cylindrical reflector 12b on which is DF antenna array 12a having eight antenna elements 12a1–12a8 mounted thereon as shown in and described with reference to FIG. 4.

Test probe antenna 22 is moved up and down along axis 25a to change angle of elevation and turntable 21 is rotated to change azimuth. By changing both of these, test probe antenna 22 can be positioned to be at any angle of incidence with respect to scaled DF antenna array 12a and model platform 12b. This is easier, more reliable and more accurate than moving test probe antenna 22 all over hemisphere 20 and not using a turntable 21.

DF array calibration manifolds must span and validly sample the incident wave arrival space. The compact range measured near field array manifold is of the same size and spans the same incident angle space as an optimum far field DF array manifold.

Although a scaled model DF antenna array and platform are referred to in this specification, a full size DF antenna array and platform may be placed on the three meter diameter on turntable 21 if they fit thereon. No scaling of size or frequency is necessary.

Before DF antenna testing is accomplished the compact antenna range must be calibrated in accordance with the teaching of the invention. Calibration is done mathematically to create a table of weighting factors specifying phase and amplitude of RF signals that will later be synthetically transmitted by a test probe antenna 22 at different angles of elevation on the hemisphere 20 and different azimuth angles of turntable 21. Each combination of an angle of elevation of the test probe antenna 22 and an azimuth setting of the turntable defines a vector from a "test point" 24 on the hemisphere 20. Thus, test points 24 are defined all over the surface of hemisphere 20 although only fifty are shown in FIG. 2. The use of the calculated weighting factors defines the best possible, emulated, in phase, constant amplitude planar wave front across the entire surface of the antenna range turntable 21.

In accordance with the teaching of the preferred embodiment of the invention the calibration weighting factor calculations for each test point 24 on the hemisphere 20 are made using a least-mean-square algorithm. The calculation of weighting factors (amplitude—and phase if necessary) for each specific center test point 23 takes into account weighting factors for a number of surrounding test points 24 to calculate the weighting factors that define the best possible emulation of an in phase, constant amplitude planar wave front over the surface of the turntable 21. This is a complex weighting and summing process that effectively transforms the near field calculations to the far field. The surrounding test points 24 around a specific test point (location of test probe antenna 22) are shown in FIG. 2.

The least mean square calculations are performed until it is determined that an emulated, in phase, constant amplitude planar wave front is defined across the surface of the turntable 21. The weighting factors are calculated once for the compact antenna test range and are later used when testing a full size or scaled down DF antenna array 21a and platform 12b on the turntable 21 at different elevations, azimuths and frequencies to directly produce the far field calibration table.

More specifically, the gradient based convergence algorithm that performs least-mean-square calculations preferably used is the one included in MATLAB's Neural Network Toolbox in the "Linear Function Output Layer" library. MATLAB, The Math Works Inc., Natick Ma. 1996.

The least-mean-square algorithm that is used by MATLAB is used for the design, training, implementation, visualization, and simulation of neural networks. It supports the most commonly used supervised and unsupervised network architectures and a comprehensive set of training and learning functions. While neural networks are usually trained continuously, with the present invention the neural network is only used to calculate weighting factors and then its use is finished.

FIG. 2 shows test probe antenna 22 at a central test point 23 that is a specific test point 24 whose weighting factors are being calculated. In this one example there are a total of fifty test points 24 surrounding the specific test point 23 which is shown at the junction of vertical axis 25a and a horizontal axis 25b. The surrounding test points 24 are located in a balanced manner to the left and right of vertical axis 25a, and in a balanced manner above and below horizontal axis 25b with the specific/center test position 23 in the middle of them at the junction of the axis. At the start of the mathematical calculations the number of test points 24 may be small but as the number of test points 24 are increased to define a planar wave front, they are added in a balanced manner about the vertical axis 25a and horizontal axis 25b, until the defined planar wave front is calculated.

The neural network calculations described in the previous paragraphs start with a starting weight of W=0 for all test points 24 surrounding a specific/center test point 23 which is assigned a starting weight W=1 indicating the desired far-field pattern. The neural network processing converges to broadband weights W that are in the neighborhood of the starting values. Azimuth symmetry about axis 25a and 25b is invoked, as previously described, along with proper electromagnetic field projection vectors.

Due to mirror image symmetry of test points 24 on either side of vertical axis 25a the calculated weighting factors for one test point 24 on one side the axis is identical to the weighting factor for a test point equally spaced on the other side of the axis. This occurs for both phase and amplitude weighting factors and simplifies the calculation of weighting factors.

These mathematical calculations are repeated for a single azimuth test arc, a set of valid sampling elevation angles and all frequencies for the compact antenna range shown in FIG. 2. Spherical symmetry provides the weights for all other azimuthally displaced arcs. At completion of processing there are weighting factors calculated for amplitude and phase for each test point 24 on the surface of hemisphere 20. The weighting factors are calculated once for the compact antenna test range and they are stored. They are used thereafter during testing of an actual size or scaled size DF antenna array 12a and platform 12b on turntable 21.

Figure 3:
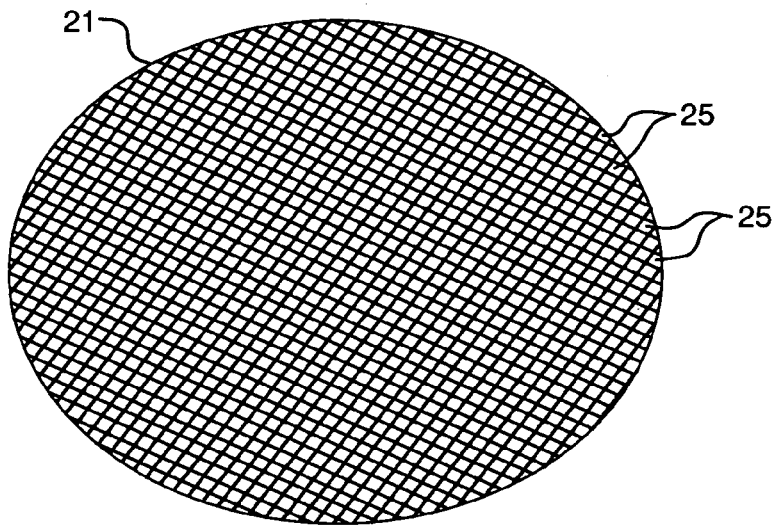
FIG. 3 is a representation of a compact antenna range turntable divided into areas for calculating weighting factors.

FIG. 3 shows turntable 21 divided into a plurality of areas to make the mathematical calculations using the MATLAB Artificial Neural Network (ANN) gradient based convergence algorithm that performs least mean square calculations to calculate weighting factors for the specific test points 24 and to define the best possible, in phase, planar wave front across turntable 21. These areas are rows and columns of fifteen square centimeter areas 25.

Figure 4:
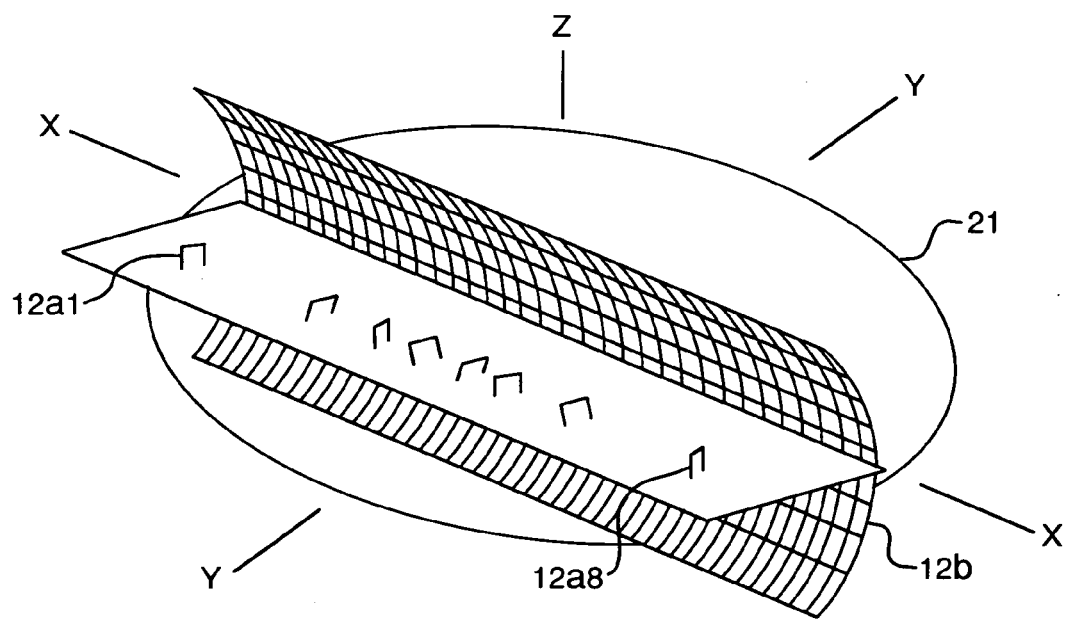
FIG. 4 is an expanded view the a turntable and DF antenna array thereon of FIG. 2.

In FIG. 4 is shown a general block diagram of an artificial neural network synthesized using the MATLAB Neural Network Toolbox. The equations shown in FIGS. 5(a)–5(d) mathematically describe the calculations performed by the least mean square calculating algorithm.

In performing the calculations to determine phase and amplitude weighting factors for test points 24 for a specified/center test point 23, a total of thirty different $W_m$ complex weights, for a total of sixty real weights, were required for the particular wavelength/geometry shown in FIG. 2. This requires a neural network input layer having sixty terminals in FIG. 6. Only a representative seven inputs are shown for the sake of simplicity.

The algorithm used to calculate the weighting factors W is now described in greater detail with reference to the equation shown in FIG. 5(a). The object of the area optimization process is to generate far field antenna (k) calibration data $Vant(k)_{cal}$ at $(\theta_i,\phi_i)$ based on Fresnel zone $Vant_{FZ}$(k) data recorded at $(\theta_i,\phi_i)$ and at M neighboring $(\theta_m,\phi_m)$ points/division 25 on turntable 21.

The desired far field response is $Vant(k)_{Far\ Field}(\theta_i,\phi_i)$. A direct solution to this problem is very DF antenna array specific. In contrast an area optimization solution, generated by the present invention, provides the same characteristic, anywhere within the calibration zone and is applicable to a wide range of DF arrays which is desirable for compact antenna ranges.

More particularly, the area optimization process is initiated by defining $I_{ff}(x_k,y_l)$ and $Q_{ff}(x_k,y_l)$ far field $E_q$ and $E_f$ responses over the turntable x-y grid divisions 25 for a particular $(\theta_i,\phi_i)$ incident electric field. The incident electric fields are then normalized at the turntable 21 center $(x_c,y_c)$ by setting $I(x_c,y_c)=1$ and $Q(x_c,y_c)=0$. Complex, probe antenna transmission to electromagnetic field transfer functions $Tr_q\{(\theta_n,\phi_n), (x_k,y_l)\}$ and $Tr_f\{(\theta_n,\phi_n), (x_k,y_l)\}$ are then computed between all $(\theta_m,\phi_m)$ array spherical coordinates (the point where each test point 24 is located) and the $(x_k,y_l)$ grid points 25 for both $E_q$ and $E_f$. $Tr\{(\theta_m,\phi_m), (x_C,y_C)\}$'s are normalized to unity at $(\theta_m,\phi_m)=(\theta_i,\phi_i)$. The polarization dependent transfer functions are obviously different for the orthogonal incident fields, but both optimization processing flows are described in the equations shown in FIG. 5(b), 5(c) and 5(d).

MATLAB artificial neural network (ANN) algorithms operate with real vectors, so complex input and output electromagnetic voltage vectors must be adapted for incorporation into the least mean square calculations as shown in FIG. 5(c). More specifically, during weighting factor calculations for each specific test point (from test probe antenna 24 to the turntable grid 25 as determined by an angle of elevation and azimuth position), the weighting factors for a number of test points 24 surrounding a specific/center test point 23 must also be considered. The process of considering the weighting factors of surrounding test points 24 is a complex summing function of the weighting factors.

Figure 6:
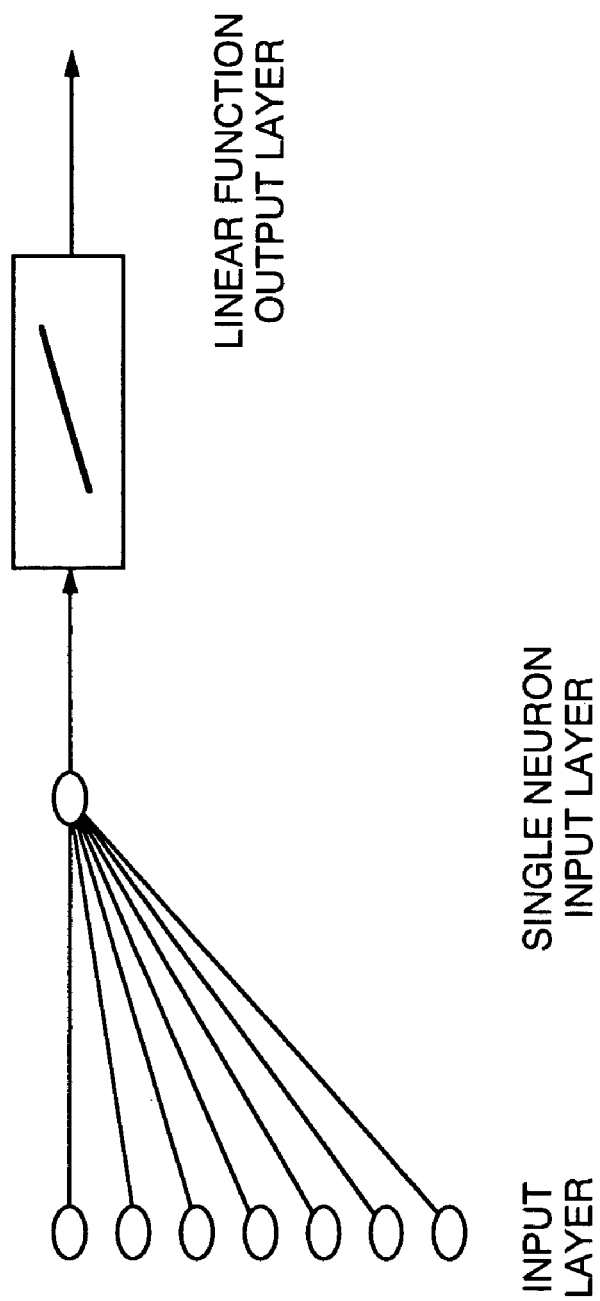
FIG. 6 shows a simplified block diagram of an artificial neural network.

Training patterns designated $I_{ff}(x_k,y_l)$ and $O_{ff}(x_k,y_l)$, used as inputs to the complex summations of the equation in FIG. 5(d), are sequenced in series into the neural network input layer of FIG. 6. In the equation shown in FIG. 5(b), $Tr^I$ is the input transfer data stream fed into $W_m^I$, when $O_{ff}(x_k,y_l)$ is the training stream; and $Tr^Q$ is the input transfer data stream fed into $W_m^I$ when $O_{ff}(x_k,y_l)$ is the training stream. Similar changes in input data streams are coded into the adaptation of the imaginary part of $W_m$.

The objective of the processing is the $W_m$ weight adjusted minimization of the equation shown in FIG. 5(d). There are several prior art techniques for minimizing this objective function, the most direct being a matrix inversion algorithm that exactly minimizes the function. However, in most cases when using the matrix inversion algorithm, the calculated weights become very large and very distant from weight values that mimic conventional compact range solutions and is not preferred as a way to perform least means square calculations. Numerical gradient based minimization algorithms are a better alternative and are used in implementing the present invention. They start with a designated set of weights and proceed to calculate a minimum set of weights by least mean square processing. The MATLAB Artificial Neural Network (ANN) Tool Box gradient based convergence algorithm is part of a back-propagation routine to perform least mean square calculations. This gradient based algorithm rapidly converges to a local minimum, with either non-linear or linear processing, and is used to implement the present invention. The inputs to this algorithm uses data streams that are weighted to minimize the difference between the weighted function and the desired pattern, here the far-field patterns $I_{ff}(x_k,y_l)$ and $Q_{ff}(x_k,y_l)$.

Using the gradient based convergence algorithm in MATLAB described above, a gradient based convergence pattern showing the magnitude of the weights associated with the minimization of $|W_1|$, associated with in incident arrival angle $(\theta_i,\phi_i)$, is observed. The minimization processing is started with all weights W set equal to zero for test points 24 surrounding a specific/center point 23 whose weighting factor $W_1$ is set equal to one.

When the processing described above is completed for all elevations, a single azimuth test arc and frequencies of interest (test points 24), a weighting factor W is calculated for each of the plurality of test points 24 on hemisphere 20. These test points 24 are the points which test probe antenna 22 emulates by changing its angle of elevation while the azimuth of turntable 21 is changed.

Using the calculated weighting factors for each test point 24 the RF signals received using the DF antenna array 22 are weighted using and are stored to create the calibration table. The calibration table is used in actual operation of a full scale platform with the DF antenna array.

Now that the weighting factors for all test points of the compact antenna range have been calculated and stored, a DF antenna array 12a mounted on a platform 12b is placed on turntable 21 for testing as shown in FIG. 4. This testing is done to develop a calibration table that is used with a full scale version of the DF antenna array in actual use. As previously mentioned, any type of antenna, whether scaled or full sized, may be tested. The only requirement is that the antenna(s) and the platform on which they are mounted fit on turntable 21. If they are too big they must be scaled to a size that will fit on turntable 21. For the remainder of this description reference is made to a scaled DF antenna array 12a mounted on a scaled platform 12b.

FIG. 4 shows a scaled down platform 12b in the form of a cylindrical reflector with a scaled down direction finding (DF) antenna array 12a thereon consisting of eight individual antenna elements 12a1–12a8 positioned on turntable 21. The particular antenna range shown in FIG. 2 has an 11 meter radius R from the surface of hemisphere 20 to the center of the 3.0 meter diameter turntable 21. At a scale of 1:50 turntable 21 can accommodate a model of a 150 meter antenna platform. Using the far-field range equation $2D^2/\lambda$), the maximum operating frequency for this antenna range is approximately 90 MHz which would limit full scale correlation's to approximately 2 MHz. The far-field range equation $2D^2/\lambda$ does not take into account the effect of the amplitude taper across a particular aperture. For compact antenna ranges such as the one shown in FIGS. 2 and 4, the amplitude taper can be significant, and obviously much different than that associated with the true far-field. The present invention compensates for the amplitude taper by defining an in phase, planar wave front across the surface of turntable 21.

As previously described with reference to FIG. 2 test probe antenna 22 is located at a specific/center test point 23 with fifty surrounding test points 24 spaced symmetrically around it. The actual number of test points 24 utilized is determined during the mathematical calculation of weighting factors for each of test points 24. In reality test probe antenna 22 does not move to a specific test point 24. Rather, to set angle of elevation antenna 22 is moved along axis 25a and turntable 21 is rotated to change the azimuth phi ($\phi$) so that antenna 22 is effectively at any desired test point 24 on hemisphere 20. Elevation is defined as zenith minus theta ($\theta$) (measured from the vertical).

To perform accurate calibration testing on the compact antenna range shown in FIG. 2 an RF signal must be generated by test probe antenna 22 at specific test points 24 defined by an angle of elevation and an azimuth, and selected frequencies. No matter which test point 24 is transmitted from the RF signals all have the same amplitude and phase. Using the calculated weighting factors for each test point 24 the RF signals received by the individual elements of DF antenna array 22 are weighted using the weighting factors and stored to create the calibration table. The calibration table is used in actual operation of a full scale platform with the DF antenna array.

More specifically, during testing of a scaled DF antenna array 12a and platform 12b on turntable 21, test probe antenna 22 is moved up and down along axis 25a to selected angles of elevation while turntable 21 is rotated degree by degree through a full circle. This is done to obtain all desired angles of incidence ($\theta$, $\phi$) while a constant amplitude and phase signal are transmitted by test probe antenna 22. The signals are received by the eight individual antenna elements 12a1–12a8 making up DF antenna array 12a in FIG. 4, are weighted using the calculated weighting factors, are frequency converted, converted to a complex voltage waveform, and are stored as the far field calibration table.

A DF receiver of a type known in the art and represented by receiver 13 in FIG. 1 receives the RF signals from each antenna element 12a1–12a8 of DF antenna array 12a, processes and stores the results. These individual antenna elements 12a1–12a8 are positioned at different angles, as shown, to permit receiving differently polarized signals. More particularly, for each test point 24 the voltages (amplitude) received by each individual antenna element of DF antenna array 12a and its phase ($\phi$) are converted into their complex form of real and imaginary vectors and are stored. Along with the complex form vectors from the eight antenna elements 12a1–12a8 the corresponding known angle of elevation, angle of azimuth and frequency are also stored. This information is known from each specified positions of turntable 21, angles of elevation test probe antenna array 22, and frequencies transmitted during testing of the DF antenna array.

Before being stored the received signals are processed and weighted as described above, including the test data described in the previous paragraphs may need to be corrected for frequency. If a scaled DF antenna array 12a is tested on turntable 21 the frequency must be scaled downward. That is, if the scaling of the model was 20:1 the test frequency used for calculating the weighting factors was scaled 1:20. Thus, if a received test frequency is twenty gigahertz it must be scaled back to one gigahertz before being stored.

This converted and stored data comprises the calibration table to be used with a full size DF antenna array 12a and platform 12b in actual operation. When a DF receiver 13 connected to an actual DF antenna array 12a receives a signal from a remote source 11 it is received by each of the eight individual antenna elements 12a1–12a8 making up DF antenna array 12a. The received signal from each of the individual antenna elements are converted into real and imaginary vectors. A search algorithm used by signal interpretation system 14 in FIG. 1 performs pattern matching to compare the real and imaginary vectors of the received signal by an actual DF antenna array 12a with the real and imaginary vectors stored during model testing. The searching is performed by taking the negative conjugate of the vector information stored in the calibration table and comparing that information to the vector information of the received signals from each of the individual antennas of the DF array. The closest pattern match yields the correct azimuth and angle of elevation of the received signal from the remote signal source 11.

To perform this signal pattern matching, a correlation interferometer direction finding (CIDF) algorithm is used. Such CIDF algorithms are known in the art and numerous versions and adaptations have been developed. The matching of a set of measured DF antenna array voltage patterns with a stored set of calibration voltage patterns is an effective technique for direction finding from complex platforms.

An advantage provided by the present invention is that the calibration table that is developed on the compact antenna range defines a near field manifold for the direction finding antenna array, and the near field manifold is of the same size and spans the same incident angle in space as a manifold developed for the direction finding antenna array in the far field.

An indicated DF bearing is assigned to the azimuth angle associated with the testing voltage set that maximizes the complex correlation coefficient during pattern matching. The complex correlation coefficient of the CIDF algorithm is given by the equation shown in FIG. 5(e) where:

$\hat{V}_n'(\Phi^i)$=complex measured voltages, $\hat{V}_n^*(\Phi^t)$=complex conjugates of the testing voltages, $\Phi^i$=azimuth angle of incident radiation, and $\Phi^t$=azimuth angle of associated with the testing voltage set As a specific illustration, the CIDF algorithm is applied to a simple linear array of uniformly spaced isotropic point sources. Using the well known notations of J. D. Kraus in his book entitled *Antennas*, New York: McGraw Hill, 1950, pp. 76–77 the measured voltages are represented by the equation:

$$\hat{V}_n'(\Phi^i)=\exp\,[(n-1)j\Psi^i] \qquad (a)$$

where $$\Psi^i=2\pi d/\lambda\,\cos\,\Phi^i+\delta$$

The testing voltages for this array are represented by the equation:

$$\hat{V}_n(\Phi^t)=\exp\,[(n-1)j\Psi^t] \qquad (b)$$

where $$\Psi^t=2\pi d/\lambda\,\cos\,\Phi^t$$

When the voltages in equations (a) and (b) immediately above are inserted into the equation in FIG. 5(e), the resultant magnitude of the correlation coefficient takes the familiar form shown in FIG. 5(f).

Under these ideal conditions, the magnitude of the correlation coefficient is unity when the test azimuth equals the incident azimuth. For the linear array, there is also an ambiguous solution at $\Phi^t=\Phi^i$.

To test the improvement in direction finding accuracy made by using the invention a CIDF algorithm was used to plot the near field to far field correlations of computed antenna voltages and to plot the errors created thereby. These computations used the well known Numerical Electromagnetic Code (NEC) to accurately analyze the assumed cylindrical reflector 12b on which is DF antenna array 12a that has eight antenna elements 12a1–12a8 mounted thereon. The NEC code is described in a report: G. J. Burke, *NEC-4 Theory and User's Manual*, Lawrence Livermore National Lab., Report UCRL-MA-109338, January 1992.

Figure 7:
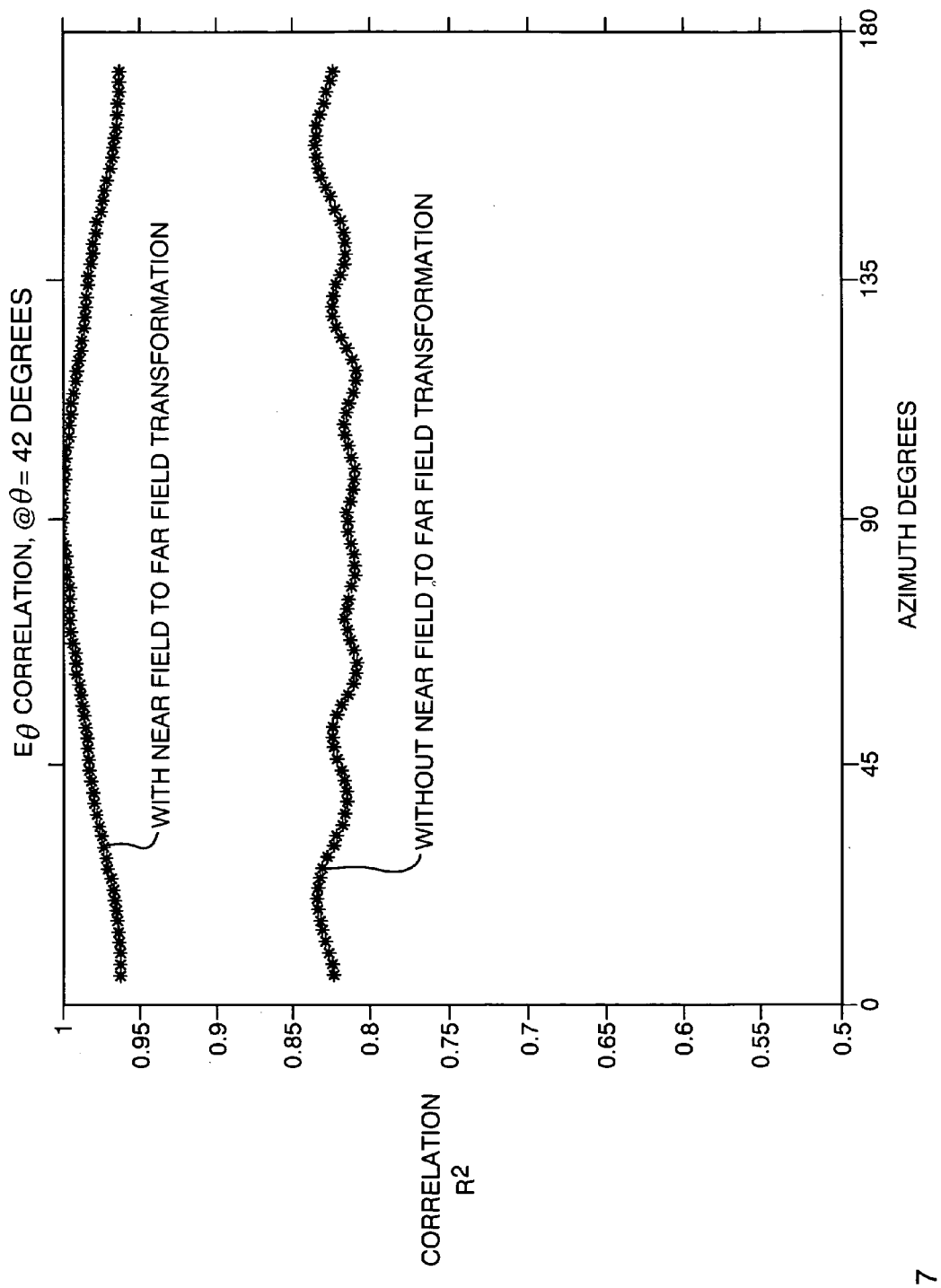
FIG. 7 shows the correlation of near field to far field measured antenna voltages with and without the use of the invention.

FIG. 7 shows Fresnel-zone $E_\theta$ induced antenna voltages that are correlated to far-field $E_\theta$ induced antenna voltages at an almost constant $|R|^2 \approx 0.85$ without the use of the present invention. This is the trace marked "Without near field to far field transformation" in FIG. 7. The standard-deviation DF error over the primary field-of-view in this case is greater than 4 degrees as shown in FIG. 8 by the trace also marked "Without near field to far field transformation".

In contrast, using the teaching of the invention to correlate Fresnel-zone $E_\theta$ induced antenna voltages to far-field $E_\theta$ induced antenna voltages, increased $|R|^2$ correlation's to values greater than 0.95 are obtained as shown in FIG. 7 with the trace marked "With near field to far field transformation". In this case the maximum standard-deviation DF errors induced in the primary field-of-view is reduced to less than 0.1 degrees as shown by the trace marked "With near field to far field transformation". Thus, it is apparent that the improvement provided by using the invention is very significant.

Figure 8:
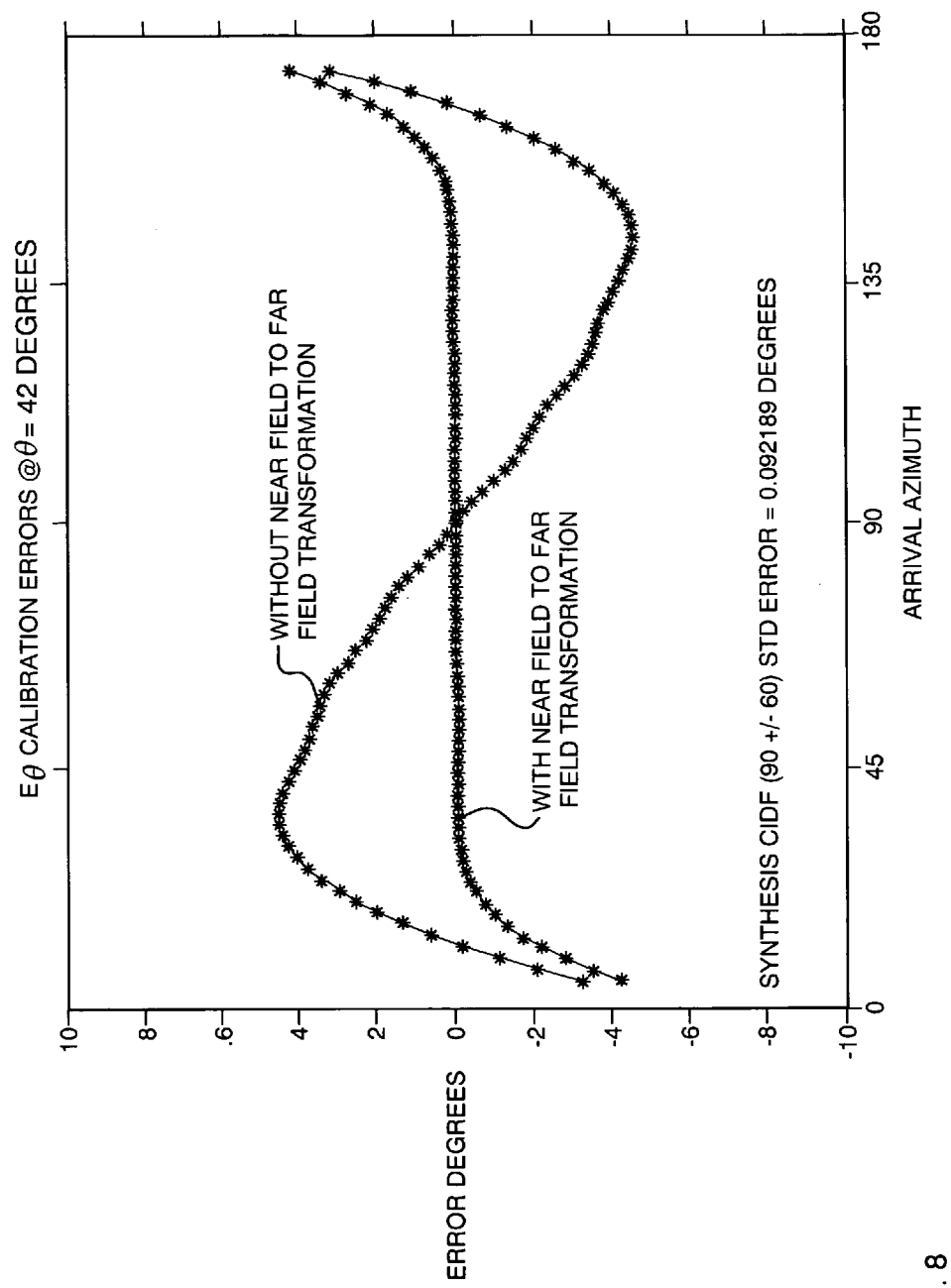
FIG. 8 shows the smaller DF error achieved when using the invention versus the prior art.

The errors shown in FIGS. 7 and 8 were calculated at a spherical angle θ=42 degrees which corresponds to an elevation angle of 48 degrees. The linear array of the individual loop antennas 12a1–12a8 in FIG. 4 has a +/−60 degree DF field-of-view relative to 90 degrees.

Figure 9A:
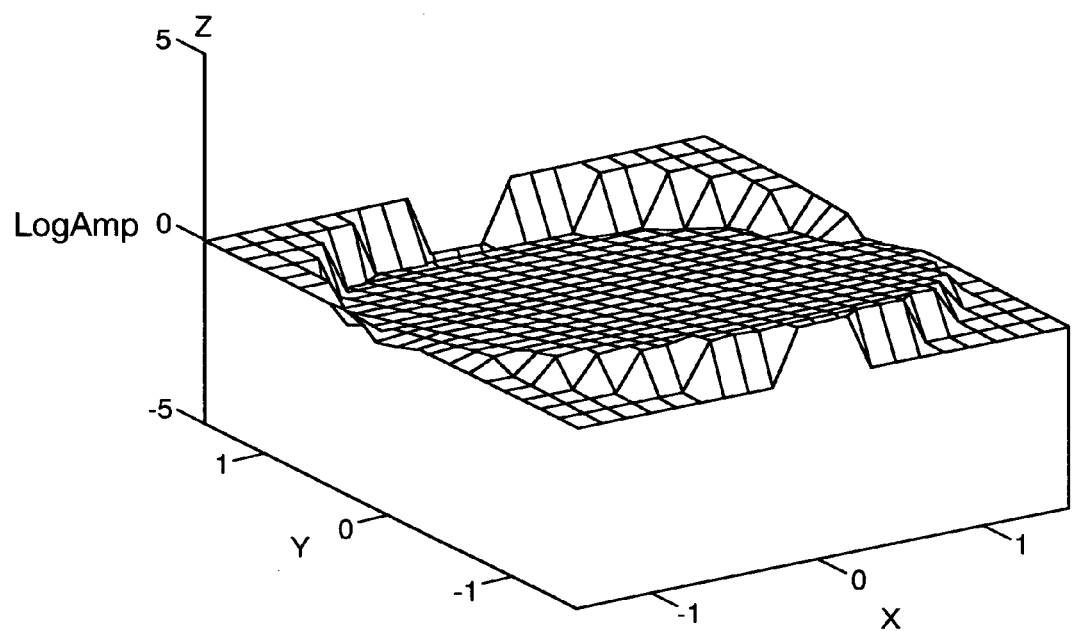
FIG. 9 shows the amplitude degradation of a planar wave front with and without neural network processing.
Figure 9B:
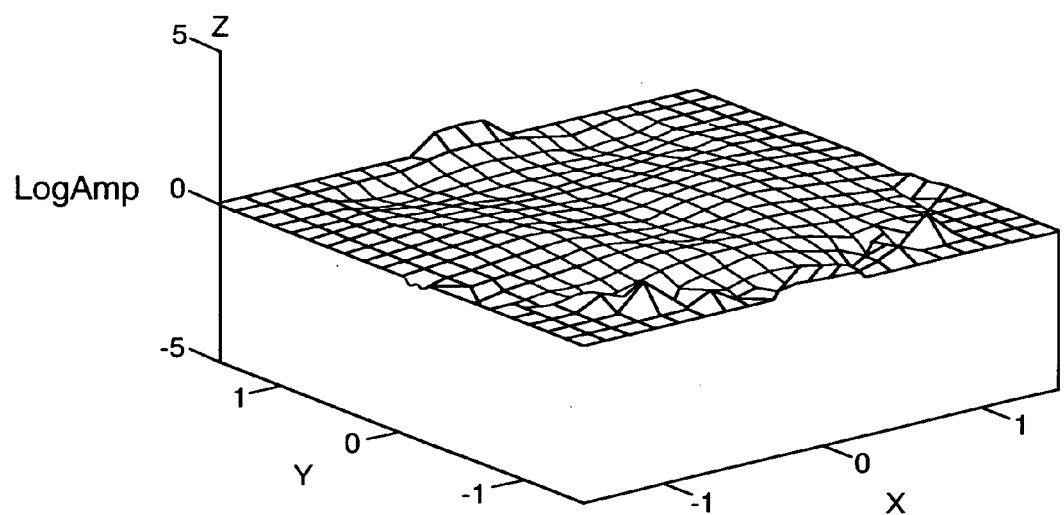

FIG. 9 shows the improvement made in calculating weighting factors to define a planar wave front having constant amplitude across the surface of turntable 21 in FIGS. 2 and 4 using neural network processing in accordance with the teaching of the invention. Using prior art methods of computing weighting factors for individual antenna elements 24 of test probe antenna 22 to adjust amplitude and define a planar wave in the near field in front of test probe antenna array 22, the results are seen in FIG. 9(a). There is a significant amplitude degradation of the defined wave front as shown. In contrast, using the MATLAB least mean square calculating neural network processing to calculate the weighting factors to define a planar wave front, the marked improvement can be seen in FIG. 9(b). There is a very uniform amplitude wave front across the plane of the turntable while at the same time having very uniform phase as described in the next paragraph with reference to FIG. 10.

Figure 10A:
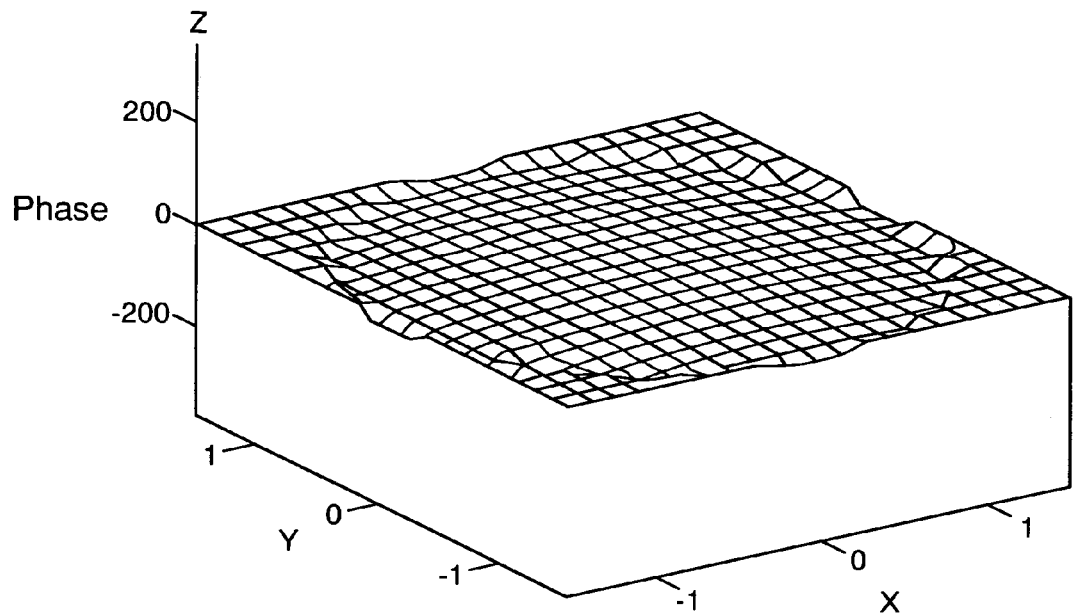
FIG. 10 shows the phase distortion of a planar wave front with and without neural network processing.
Figure 10B:
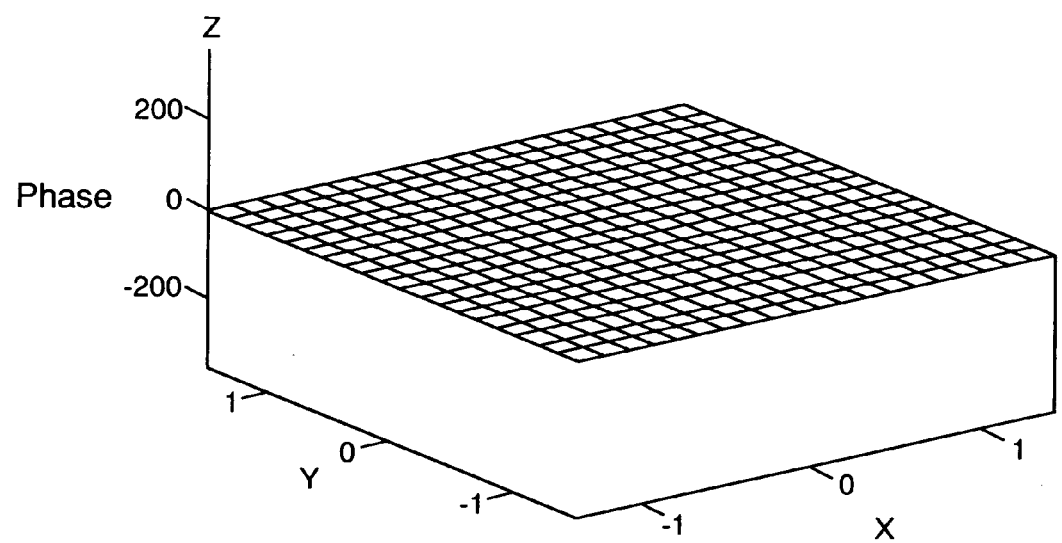

FIG. 10 shows the improvement made in calculating weighting factors to define an in phase wave front across the surface of turntable 21 in FIGS. 2 and 4 using ANN processing in accordance with the teaching of the invention. Using prior art methods of computing weighting factors for individual antenna elements 24 of test probe antenna 22 to adjust phase to define a planar wave in the near field in front of test probe antenna array 22 the results are seen in FIG. 10(a). In contrast, using the MATLAB least mean square calculating ANN processing to calculate the weighting factors to define a planar wave front, the marked improvement in phase uniformity can be seen in FIG. 10(b). Thus, the planar wave front that is generate in the near field of a compact antenna range appears that it comes from the far field and accurate calibration data may be prepared.

While what has been described herein is the preferred embodiment of the invention, it will be understood by those knowledgeable in the art that numerous changes may be made without departing from the spirit and scope of the invention. For example, while a DF antenna array is taught herein, any type of directional antenna may be tested and a calibration table generated.

What is claimed is:

1. A method for improving directional measurements made using a direction finding antenna array and receiver where weighting factors are first calculated for a compact antenna range, then a full scale or scaled model of the antenna array is placed on a test table of the compact antenna range and receives radio frequency test signals transmitted by a test probe antenna of the antenna range to develop a calibration table that is later used with the full scale direction finding antenna array in actual use to make more accurate direction finding measurements, said method comprising the steps of:

calculating weighting factors defining in phase, constant amplitude, planar wave fronts impinging on the test table at a plurality of specific angles of incidence;

performing the weighting factor calculations for each specific angle of incidence by taking into consideration a plurality of different angles of incidence surrounding each specific angle of incidence to emulate an in phase, constant amplitude planar wave front that is optimized over the area of the test table for each specific angle of incidence; and transforming the test signals received by the direction finding antenna array on the test table using the weighting factors and storing the transformed signals in the calibration table to be used in actual use to make more accurate direction finding measurements.

2. The method in accordance with claim 1 further comprising the step of:

transmitting a radio frequency signal using the test probe antenna of the antenna range, the radio frequency signal being transmitted at the specific angles of incidence, and the radio frequency signals are received using the direction finding antenna array on the test table at the last mentioned specific angles of incidence.

3. The method in accordance with claim 2 wherein the transformed radio frequency signals are stored as complex voltage waveforms, and further comprising the step of:

comparing the voltages received by the direction finding antenna array in actual use and in complex form to voltages in complex form stored in the calibration table by pattern matching to make accurate direction finding measurements.

4. The method in accordance with claim 3 wherein the step of performing the weighting factor calculations for each specific angle of incidence utilizes a least mean square calculating algorithm.

5. The method in accordance with claim 4 wherein the step of transmitting a radio frequency signal using the test probe antenna transmits a constant amplitude, constant phase signal.

6. The method in accordance with claim 1 further comprising the step of performing the weighting factor calculations for each specific angle of incidence utilizes a least mean square calculating algorithm.

7. The method in accordance with claim 1 wherein the signals received by the full scale or scaled model of the direction finding antenna array on the test table from the test probe antenna and used to develop the calibration table are voltages that are converted to complex voltages, the signals received by the full scale direction finding antenna array in actual use are voltages that are converted to complex voltages, and further comprising the step of:

comparing the complex voltages received by the direction finding antenna array in actual use to voltages in complex form stored in the calibration table by pattern matching to make accurate direction finding measurements.

8. The method in accordance with claim 7 wherein the step of performing the weighting factor calculations for each specific angle of incidence utilizes a least mean square calculating algorithm.

9. The method in accordance with claim 8 wherein the radio frequency test signals transmitted by the test probe antenna of the antenna range have constant amplitude.

10. The method in accordance with claim 1 wherein the calibration table that is developed on the compact antenna range defines a near field manifold for the direction finding antenna array, and the near field manifold is of the same size and spans the same incident angle space as a manifold developed for the direction finding antenna array in the far field so may be used for pattern matching of waveforms in the far field.

11. A system for calculating weighting factors for use with a compact antenna range that has a test table, the weighting factors being used to adjust phase and/or amplitude of radio frequency test signals radiated from a test probe antenna of the range, and the compact antenna range is used for testing a direction finding antenna array and a platform on which it is mounted that are placed on a test table of the antenna range to develop a calibration table that is later used with the direction finding antenna array and platform to make accurate direction finding measurements, said system comprising:

means for calculating weighting factors defining in phase, constant amplitude, planar wave fronts impinging on the test table at a plurality of specific angles of incidence;

means for performing the weighting factor calculations for each specific angle of incidence by taking into consideration a plurality of different angles of incidence surrounding each specific angle of incidence to emulate an in phase, constant amplitude planar wave front that is optimized over the area of the test table for each specific angle of incidence; and means for transforming the test signals received by the direction finding antenna array on the test table using the calculated weighting factors and storing the transformed test signals in the calibration table to be used in actual use to make more accurate direction finding measurements.

12. The system in accordance with claim 11 wherein the signals received by the full scale or scaled model of the direction finding antenna array on the test table from the test probe antenna and used to develop the calibration table are voltages that are converted to complex voltages, the signals received by the full scale direction finding antenna array in actual use are voltages that are converted to complex voltages, and further comprising:

means for comparing the complex voltages received by the direction finding antenna array in actual use to voltages in complex form stored in the calibration table by pattern matching to make accurate direction finding measurements.

13. The system in accordance with claim 12 wherein the means for calculating weighting factors for each specific angle of incidence utilizes a least mean square calculating algorithm.

14. The system in accordance with claim 13 wherein the radio frequency test signals transmitted by the test probe antenna of the antenna range have constant amplitude.

15. The system in accordance with claim 11 further comprising means for transmitting a radio frequency signal using the test probe antenna of the antenna range, the radio frequency signal being transmitted at the specific angles of incidence, and the radio frequency signals are received using the direction finding antenna array on the test table at the last mentioned specific angles of incidence.

16. The system in accordance with claim 15 wherein the transformed radio frequency signals are stored as complex voltage waveforms, and further comprising means for comparing the voltages received by the direction finding antenna array in actual use and in complex form to voltages in complex form stored in the calibration table by pattern matching to make accurate direction finding measurements.

17. The system in accordance with claim 16 wherein the step of performing the weighting factor calculations for each specific angle of incidence utilizes a least mean square calculating algorithm.

18. The system in accordance with claim 17 wherein the step of transmitting a radio frequency signal using the test probe antenna transmits a constant amplitude, constant phase signal.

19. The system in accordance with claim 11 further comprising means for calculating weighting factors for each specific angle of incidence utilizes a least mean calculating square algorithm.

20. The system in accordance with claim 11 wherein the calibration table that is developed on the compact antenna range defines a near field manifold for the direction finding antenna array, and the near field manifold is of the same size and spans the same incident angle space as a manifold developed for the direction finding antenna array in the far field so may be used for pattern matching of waveforms in the far field.

* * * * *